(12) United States Patent
Kang

(10) Patent No.: US 8,816,480 B2
(45) Date of Patent: Aug. 26, 2014

(54) ELECTRONIC DEVICE PACKAGES AND METHODS OF MANUFACTURING THE SAME

(71) Applicant: SK hynix Inc., Icheon-si (KR)

(72) Inventor: Tae Jim Kang, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/718,899

(22) Filed: Dec. 18, 2012

(65) Prior Publication Data

US 2014/0015072 A1 Jan. 16, 2014

(30) Foreign Application Priority Data

Jul. 13, 2012 (KR) .................. 10-2012-0076615

(51) Int. Cl.
*H01L 23/495* (2006.01)
*H01L 29/84* (2006.01)
*H01L 23/498* (2006.01)

(52) U.S. Cl.
CPC ....... *H01L 29/84* (2013.01); *H01L 2224/48091* (2013.01); *H01L 23/4985* (2013.01); *H01L 23/49816* (2013.01); *H01L 2224/32145* (2013.01); *H01L 2224/73265* (2013.01); *H01L 23/495* (2013.01)
USPC .................. 257/666; 257/787; 257/E23.031; 257/E23.037; 257/E23.043; 438/111; 438/112

(58) Field of Classification Search
CPC ... H01L 21/56; H01L 23/28; H01L 23/49816; H01L 33/52; H01L 23/10; H01L 25/0657
USPC ......... 257/666, 667, 678, 684, 687, 723, 777, 257/787, E23.031, E23.037, E23.042, 257/E23.043, E23.124, E23.125, E23.126; 438/111, 112, 125, 126, 127
See application file for complete search history.

(56) References Cited

U.S. PATENT DOCUMENTS

| 5,866,818 | A | * | 2/1999 | Sumi et al. | 73/514.33 |
| 6,112,594 | A | * | 9/2000 | Brinks et al. | 73/493 |
| 7,595,548 | B2 | * | 9/2009 | Shirasaka et al. | 257/676 |
| 8,309,385 | B2 | * | 11/2012 | Matsunaga et al. | 438/51 |

FOREIGN PATENT DOCUMENTS

KR 10-2004-0012896 A 2/2004

* cited by examiner

*Primary Examiner* — Eduardo A Rodela
(74) *Attorney, Agent, or Firm* — William Park & Associates Ltd.

(57) ABSTRACT

The electronic device package includes a package substrate including a frame portion and a cantilever portion surrounded by the frame portion, at least one semiconductor chip mounted on the cantilever portion, and a molding member disposed on the package substrate to cover the at least one semiconductor chip. The cantilever portion has a first edge connected to the frame portion and declines from the first edge toward a second edge located opposite to the first edge. Related methods are also provided.

19 Claims, 7 Drawing Sheets

ELECTRONIC DEVICE PACKAGES AND METHODS OF MANUFACTURING THE SAME

CROSS-REFERENCES TO RELATED APPLICATIONS

The present application claims priority under 35 U.S.C. 119(a) to Korean Application No. 10-2012-0076615, filed on Jul. 13, 2012, in the Korean intellectual property Office, which is incorporated herein by reference in its entirety as set forth in full.

BACKGROUND

Embodiments of the present disclosure relate to electronic device packages and methods of manufacturing the same.

Electronic devices contained in electronic systems may include various circuit elements such as active elements and/or passive elements. The circuit elements may be integrated on a semiconductor substrate, thereby constituting the electronic device (also referred to as a semiconductor chip or a semiconductor die). The electronic device may be mounted on a printed circuit board (PCB) or a package substrate to produce an electronic device package. The package substrate may include circuit interconnections such as silicon interposers.

Demand for high performance electronic systems have required a reduction in the thickness of the electronic device packages. Accordingly, it may be necessary to reduce the thickness of a molding material or a protection member that serve to protect the semiconductor chip mounted on the package substrate. However, if the thickness of the molding material is reduced, a flow rate of the molding material introduced into cavities may be non-uniform depending on positions of the cavities. The non-uniformity of the flow rate of the molding material may cause process defects such as voids in the molding material.

SUMMARY

Various embodiments are directed to electronic device packages and methods of manufacturing the same.

According to an embodiment, an electronic device package includes a package substrate including a frame portion and a cantilever portion surrounded by the frame portion, at least one semiconductor chip mounted on the cantilever portion, and a molding member disposed on the package substrate to cover the at least one semiconductor chip. The cantilever portion has a first edge connected to the frame portion and descends from the first edge toward a second edge located opposite to the first edge.

According to another embodiment, a method of manufacturing an electronic device package includes mounting at least one semiconductor chip on a cantilever portion whose first edge is connected to a frame portion of a package substrate, and forming a molding member on the package substrate to cover the at least one semiconductor chip. The cantilever portion descends from the first edge of the cantilever portion toward a second edge of the cantilever portion located opposite to the first edge during formation of the molding member.

According to another embodiment, a method of manufacturing an electronic device package includes mounting at least one semiconductor chip on a cantilever portion whose first edge is connected to a frame portion of a package substrate, disposing the package substrate and the at least one semiconductor chip mounted on the package substrate in a space between an upper frame having an upper cavity and a lower frame having a lower cavity that accommodates the cantilever portion, and injecting a molding material into the upper cavity to form a molding member covering the at least one semiconductor chip. A second edge of the cantilever portion opposite to the first edge descends into the lower cavity during injection of the molding material.

The thickness of the molding member on the at least one semiconductor chip may gradually increase from the first edge toward the second edge because of the cantilever portion which descends.

The molding member may include an extension that downwardly protrudes from a bottom surface of the frame portion to cover bottom surfaces of edges of the cantilever portion other than the first edge.

The frame portion may be separated from edges of the cantilever portion other than the first edge by a separation window.

The separation window may have a "U"-shaped configuration in a plan view.

The at least one semiconductor chip may include a plurality of semiconductor chips which are stacked on the cantilever portion.

The plurality of semiconductor chips may be stacked to be vertically misaligned with each other such that at least first edges of the plurality of semiconductor chips constitute a step structure.

The electronic device package may further include bonding wires that electrically connect chip pads of the at least one semiconductor chip to landing pads of the package substrate.

The electronic device package may further include bonding wires that electrically connect chip pads of the at least one semiconductor chip to landing pads of the frame portion constituting the package substrate.

Forming the molding member may include disposing the package substrate and the at least one semiconductor chip mounted on the package substrate in a space between an upper frame having an upper cavity and a lower frame having a lower cavity that accommodates the inclined cantilever portion, and injecting a molding material into the upper cavity.

The molding material may be injected through an inlet of the upper frame which is positioned adjacent to the first edge of the cantilever portion, and the second edge of the cantilever portion may descend as the molding material flows from the first edge of the cantilever portion toward the second edge of the cantilever portion.

The lower frame may be formed to include an inclined bottom surface that contacts and supports the cantilever portion when the cantilever portion descends.

BRIEF DESCRIPTION OF THE DRAWINGS

Embodiments will become more apparent in view of the attached drawings and accompanying detailed description, in which.

DETAILED DESCRIPTION OF THE EMBODIMENTS

Figure 1:
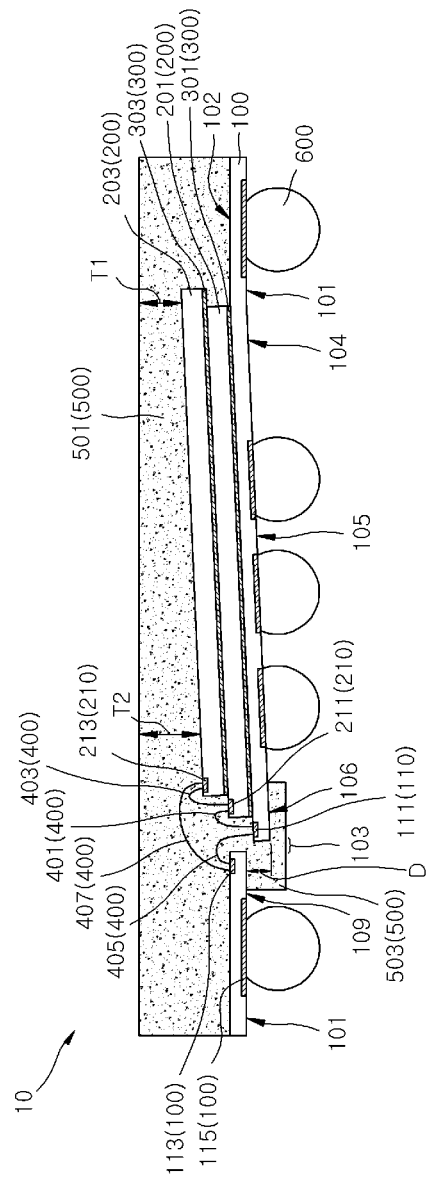
FIG. 1 is a cross sectional view illustrating an electronic device package according to an embodiment.

According to various embodiments, electronic device packages that are capable of suppressing formation of voids in a molding material for protecting a semiconductor chip, are provided. Further, the methods of manufacturing electronic device packages are also provided. As a result, thin electronic device packages may be realized without process defects such as voids.

The electronic device package according to an embodiment may include a package substrate having a cantilever portion whose first edge is connected to a frame portion. Edges of the cantilever portion may be surrounded by the frame portion. The package substrate may be construed as a member, for example, a printed circuit board (PCB) or a flexible substrate on which a semiconductor chip or an integrated circuit chip is mounted. The package substrate may include terminals, which is connected to internal circuit interconnections or external interconnections, such as landing pads. The terminals (e.g., the landing pads) may be disposed on a body of the package substrate. The package substrate may also include through electrodes (also referred to as through vias) that penetrate the body thereof to electrically connect some interconnections (or some terminals) on a top surface thereof with other interconnections (or other terminals) on a bottom surface thereof. In some embodiments, the package substrate may be a multi-layered PCB that further includes internal circuit interconnections disposed therein. The cantilever portion may be combined with the frame portion such that a second edge of the cantilever portion, which is located opposite to the first edge of the cantilever portion, descends.

It will be understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the inventive concepts. As used herein the term "and/or" includes any and all combinations of one or more of the associated listed items.

It will be also understood that when an element is referred to as being located "under", "beneath", "below", "lower", "on", "over", "above", "upper", "side" or "aside" another element, it can be in directly contact with the other element, or at least one intervening element may also be present therebetween. Accordingly, the terms such as "under", "beneath", "below", "lower", "on", "over", "above", "upper", "side", "aside" and the like which are used herein are for the purpose of describing particular embodiments only and are not intended to limit the inventive concepts.

In addition, spatially relative terms, such as "beneath", "below", "lower", "above", "upper", "top", "bottom" and the like may be used to describe an element and/or feature's relationship to another element(s) and/or feature(s) as, for example, illustrated in the figures. It will be understood that the spatially relative terms are intended to encompass different orientations of the device (or a package) in use and/or operation in addition to the orientation depicted in the figures. For example, when the device in the figures is turned over, elements described as below and/or beneath other elements or features would then be oriented above the other elements or features. The device may be otherwise oriented (rotated 90 degrees or at other orientations) and the spatially relative descriptors used herein interpreted accordingly.

It will be further understood that the term "semiconductor chip" used herein may correspond to a semiconductor die or a semiconductor substrate including a large scale integrated circuit (LSI), for example, a DRAM circuit or a flash memory circuit. Moreover, it will be understood that the term "chip pad" or "landing pad" used herein may correspond to a conductive member for electrical connection.

Figure 2:
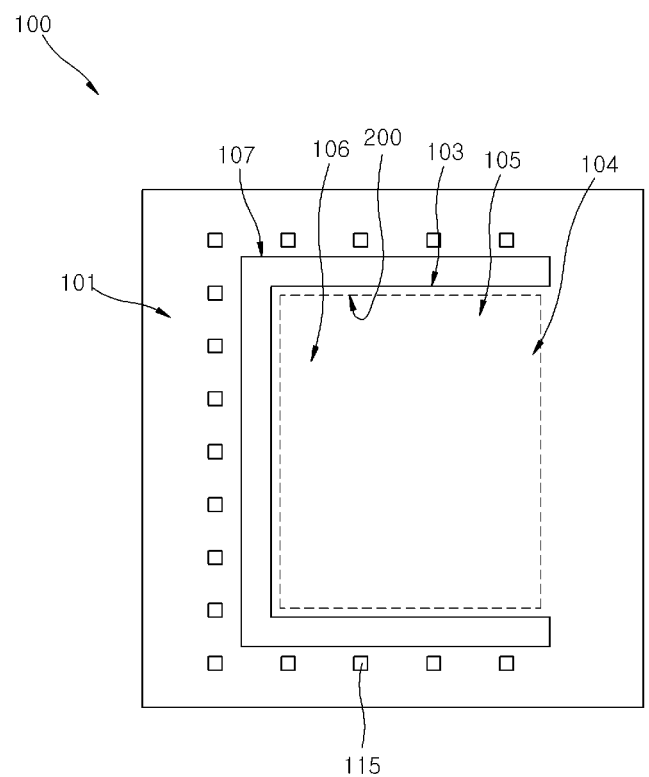
FIG. 2 is a plan view illustrating an electronic device package according to an embodiment.

FIGS. 1 and 2 are a cross sectional view and a plan view illustrating an electronic device package according to an embodiment, respectively. Referring to FIG. 1, an electronic device package 10 according to an embodiment may be configured to include at least one semiconductor chip 200 mounted on a package substrate 100 and a molding member 500 encapsulating the semiconductor chips 200. The at least one semiconductor chip may include two or more semiconductor chips. The package substrate 100 may be a member, for example, a printed circuit board (PCB) or a flexible substrate on which the semiconductor chips 200 or integrated circuit chips are mounted. The semiconductor chips 200 may be attached to the package substrate 100 using adhesion layers 300 disposed therebetween, and the semiconductor chips 200 may be electrically connected to the package substrate 100 using connection members 400 such as bonding wires. The semiconductor chips 200 may include two or more chips which are stacked. For example, the semiconductor chips 200 may include a first semiconductor chip 201 which is stacked on and attached to the package substrate 100 using a first adhesion layer 301 therebetween and a second semiconductor chip 203 which is stacked on and attached to a side of the first semiconductor chip 201 opposite to the package substrate 100 using a second adhesion layer 303 therebetween. At least one additional semiconductor chip may be further stacked on a side of the second semiconductor chip 203 opposite to the first semiconductor chip 201.

The first and second semiconductor chips 201 and 203 may be stacked to be vertically misaligned with each other, as illustrated in FIG. 1. Accordingly, at least first edges of the first and second semiconductor chips 201 and 203 may constitute a step structure. Alternatively, the first and second semiconductor chips 201 and 203 may be stacked to be vertically aligned with each other. In such a case, the first edges of the first and second semiconductor chips 201 and 203, which are vertically stacked, may not constitute a step structure. As illustrated in FIG. 1, when the first and second semiconductor chips 201 and 203 are stacked to have a step structure, the second semiconductor chip 203 may be stacked to expose a first chip pad 211 which is disposed on the first edge of the first semiconductor chip 201. The exposed first chip pad 211 may act as a contact portion for electrically connecting the first semiconductor chip 201 to an external device. For example, the first chip pad 211 may be electrically connected to a first landing pad 111 of the package substrate 100 using a first bonding wire 401.

The first chip pad 211 may also be electrically connected to a second chip pad 213 disposed on the first edge of the second semiconductor chip 203 using a second bonding wire 403. Thus, the second semiconductor chip 203 may be electrically connected to the first landing pad 111 of the package substrate 100 through the first and second bonding wires 401 and 403 (e.g., bonding wires 400). That is, the first and second semiconductor chips 200 may be electrically connected to the package substrate 100 by vertically stacking the semiconductor chips 200 to have a step structure, electrically connecting the first and second chip pads 211 and 213 (e.g., chip pads 210) to each other using the second bonding wire 403, and electrically connecting the first chip pad 211 to the first landing pad 111 of the package substrate 100 using the first bonding wire 401. Although not shown in the drawings, the semiconductor chips 200 may be electrically connected to the package substrate 100 using connection bumps. In such a case, the first and second semiconductor chips 201 and 203 may be vertically aligned with each other without having a step structure and may be electrically connected to each other using through vias or through electrodes such as through silicon vias (TSVs).

The package substrate 100 on which the semiconductor chips 200 are stacked or mounted may be configured to include a frame portion 101 and a cantilever portion 105 surrounded by the frame portion 101, as illustrated in a plan view of FIG. 2. Only a first edge 104 of the cantilever portion 105 may be physically connected to the frame portion 101. Thus, the cantilever portion 105 may be combined with the frame portion 101 in a single-arm manner. Other edges 103 of the cantilever portion 105 may be separated from the frame portion 101 by a separation window 107. The separation window 107 may have a 'U'-shaped configuration or a horse's hood shape in a plan view but not limited thereto. That is, the shape of the separation window 107 may be modified diversely if the cantilever portion 105 is formed in a single-arm manner.

The cantilever portion 105 may have an inclined shape that downwardly extends from the first edge 104 toward the frame portion 101 that is adjacent to a second edge 106 opposite to the first edge 104, as illustrated in FIG. 1. Thus, the second edge 106 of the cantilever portion 105, which is located opposite to the first edge 104, may be lower than the frame portion 101 in reference to a horizontal axis parallel with the frame portion 101. This may be because only the first edge 104 of the cantilever portion 105 is physically connected to the frame portion 101 and other edges 103 of the cantilever portion 105 are spaced apart from the frame portion 101. Thus, the cantilever portion 105 may descend even though the frame portion 101 has a horizontally flat shape. Therefore, the semiconductor chips 200 may be encapsulated with the cantilever portion 105 inclined. As a result, there may be a level difference D between the second edge 106 and the frame portion 101.

Since the cantilever portion 105 may descend from the frame portion 101, the molding member 500 encapsulating the semiconductor chips 200 may be formed to have a non-uniform thickness according to positions thereof after the electronic device package is manufactured. The molding member 500 may be formed by injecting a dielectric material such as an epoxy molding compound (EMC) material into a frame. The cantilever portion 105 may be pressurized to descend while the molding material is injected. Thus, the thickness of the molding member 500 on a top surface of the uppermost chip 203 of the semiconductor chips 200 may gradually increase from the first edge 104 of the cantilever portion 105 toward the second edge 106 of the cantilever portion 105. That is, since the cantilever portion 105 has an inclined shape that downwardly extends from the first edge 104 toward the second edge 106, a first thickness T1 of the molding member 500 over the first edge 104 may be less than a second thickness T2 of the molding member 500 over the second edge 106. As the level difference D between the second edge 106 and the frame portion 101 increases, a difference between the first and second thicknesses T1 and T2 may also increase.

As described above, the cantilever portion 105 may be combined with the frame portion 101 in a single-arm manner. That is, only one edge of the cantilever portion 105 is physically connected to the frame portion 101, and the other edges of the cantilever portion 105 are separated from the frame portion 101 by the separation window 107. Thus, the separation window 107 may have a moat shape. During formation of the molding member 500, the molding material injected onto the package substrate 100 may flow out of a frame through the separation window 107. Accordingly, the molding member 500 may be formed to have an extension 503 that fills the separation window 107 and covers bottom surfaces of the other edges 103 of the cantilever portion 105. That is, the extension 503 may downwardly protrude from the bottom surfaces of the other edges 103 of the cantilever portion 105.

External connection terminals 600 may be attached to a bottom surface 109 of the package substrate 100 opposite to the semiconductor chips 200 which is mounted on a top surface 102 of the package substrate 100. The external connection terminals 600 may electrically connect the electronic device package 10 to a substrate or a board of another package module. The external connection terminals 600 may be solder balls, and external connection pads 115 may be disposed between the solder balls and the bottom surface of 109 the package substrate 100. The external connection terminals 600 and the external connection pads 115 may be disposed on a bottom surface of the frame portion 101 as well as on a bottom surface of the cantilever portion 105 when a slope of the cantilever portion 105 is within an allowable range. However, in the event that a slope of the cantilever portion 105 is greater than an allowable range, it may be difficult to attach the solder balls to the bottom surface of the cantilever portion 105. In such a case, the external connection pads 115 and external connection terminals 600 (e.g., the solder balls) may be disposed on only the bottom surface of the frame portion 101.

The first landing pad 111 on the top surface 102 of the package substrate 100 (e.g., the frame portion 101) may be electrically connected to the external connection pads 115 on the bottom surface 109 of the package substrate 100 by internal circuits (not shown) or through vias (not shown) in the package substrate 100. The external connection pads 115 on a bottom surface of the frame portion 101 may be electrically connected to second landing pads 113 on a top surface of the frame portion 101 (connection not shown), and the second landing pads 113 may be electrically connected to the semiconductor chips 200 by third bonding wires 405 that electrically connect the first landing pads 111 to the second landing pads 113.

The third bonding wires 405 may electrically connect the first landing pads 111 to the second landing pads 113 even though the cantilever portion 105 has a declining figure. Accordingly, the semiconductor chips 200 may be electrically connected to the external connection pads 115 disposed on the bottom surface of the frame portion 101 by connecting the first and second chip pads 210 (211 and 213) to each other using the second bonding wires 403, connecting the first chip pads 211 to the first landing pads 111 of the package substrate 100 using the first bonding wires 401, and connecting the first landing pads 111 to the second landing pads 113 using the third bonding wires 405.

The electronic device package 10 may further include fourth bonding wires 407 that directly connect the chip pads 210 of the semiconductor chips 200 to the second landing pads 113 disposed on the frame portion 101 of the package substrate 100. For example, the second chip pads 213 of the second semiconductor chip 203 may be directly connected to the second landing pads 113 disposed on the frame portion 101 by the fourth bonding wires 407.

Figure 3:
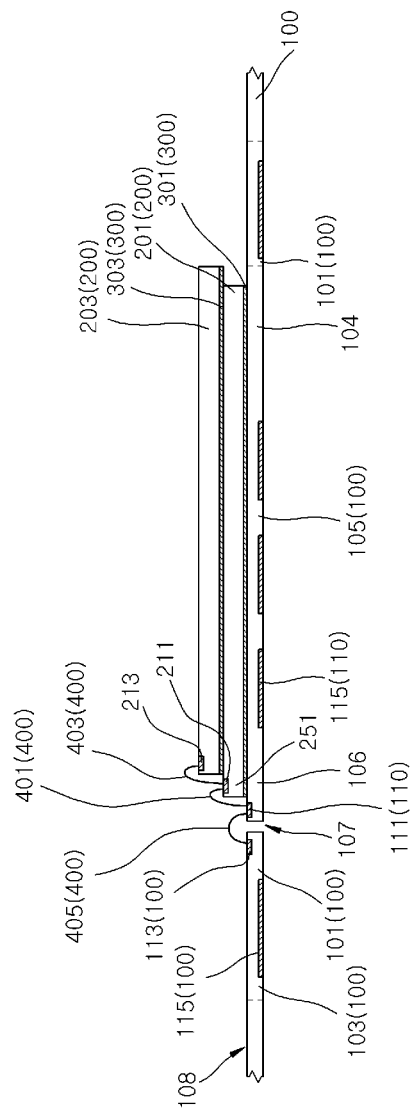
FIGS. 3 to 6 are cross sectional views illustrating a method of manufacturing an electronic device package according to an embodiment.
Figure 5:
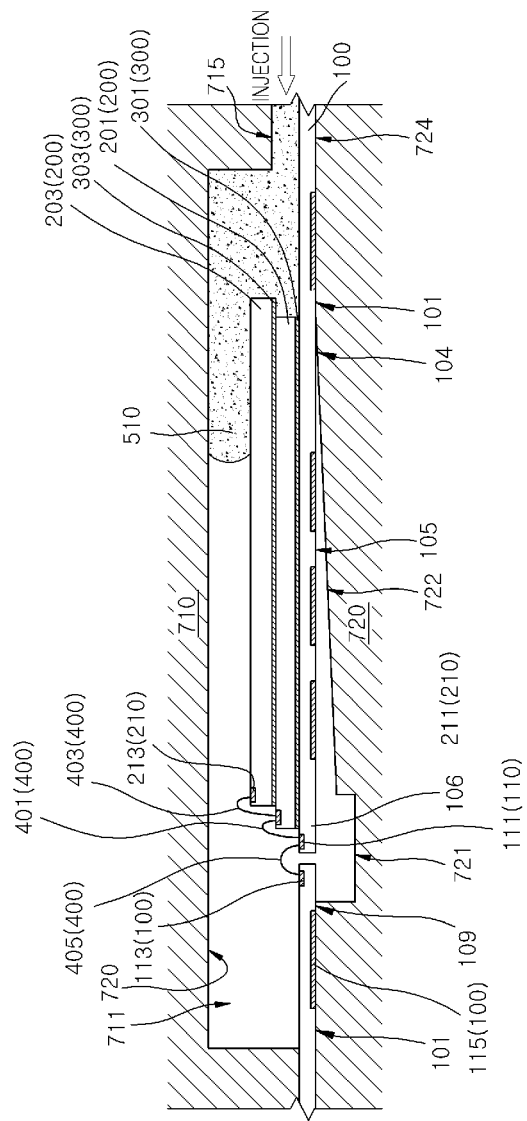
Figure 6:
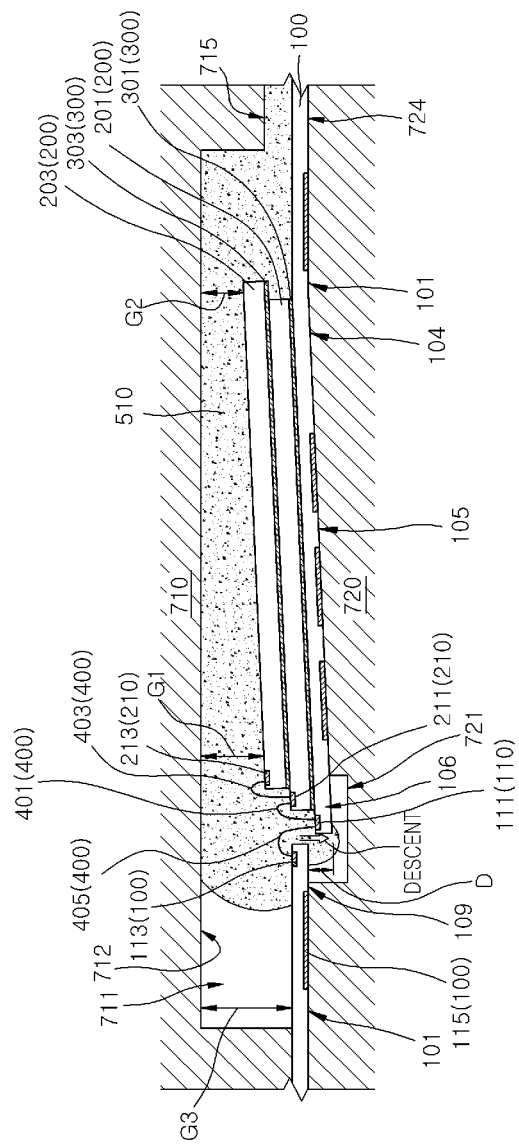
Figure 7:
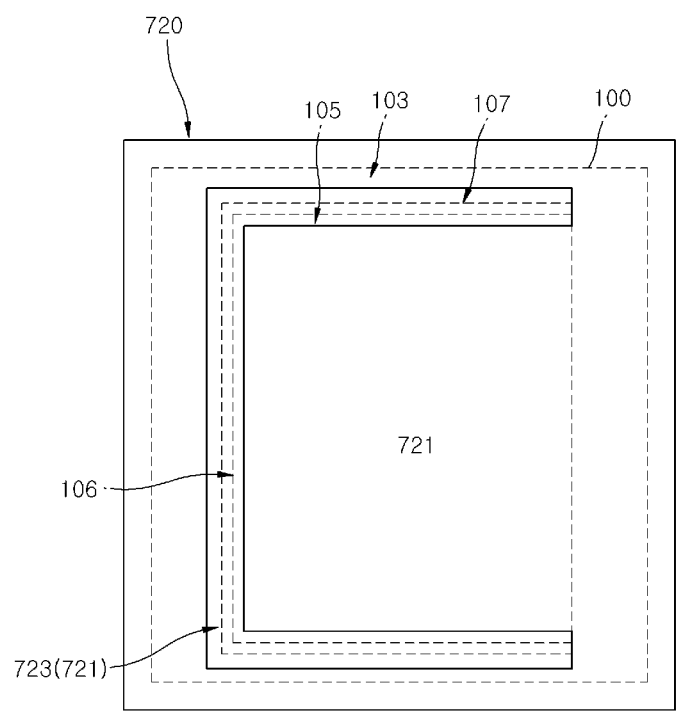
FIG. 7 is a plan view illustrating a method of manufacturing an electronic device package according to an embodiment.

FIGS. 3 to 6 are cross sectional views illustrating a method of manufacturing an electronic device package according to an embodiment, and FIG. 7 is a plan view illustrating a method of manufacturing an electronic device package according to an embodiment. Referring to FIG. 3, semiconductor chips 200 may be mounted on a cantilever portion 105 of a package substrate 100. The cantilever portion 105 may be a portion of the package substrate 100 and may be formed in a single-arm manner, as illustrated in FIG. 2. That is, only a first edge 104 of the cantilever portion 105 may be physically connected to a frame portion 101 corresponding to a portion of the package substrate 100, and the other edges 103 of the cantilever portion 105 may be separated from the frame portion 101 by a separation window 107. The package substrate 100 may correspond to a panel 108 including two or more cantilever portions 105 for mass production. However, for the purpose of ease and convenience in explanation, the following embodiments may be developed under the assumption that the package substrate 100 includes a single cantilever portion 105.

A first semiconductor chip 201 may be attached to the package substrate 100 using a first adhesion layer 301, and a second semiconductor chip 203 may be attached to a top surface of the first semiconductor chip 201 opposite to the package substrate 100 using a second adhesion layer 303. The second semiconductor chip 203 parallel with the top surface of the first semiconductor chip 201 may be stacked on the first semiconductor chip 201 in such a way as to constitute a step structure. That is, the second semiconductor chip 203 may be stacked on the first semiconductor chip 201 to expose first chip pads 211 disposed on an edge 251 of the first semiconductor chip 201. The first chip pads 211 may be used as contact portions for electrically connecting the first semiconductor chip 201 to other elements. First bonding wires 401 may be formed to electrically connect the first chip pads 211 to first landing pads 111 of the package substrate 100. Second bonding wires 403 may be formed to electrically connect second chip pads 213 of the second semiconductor chip 203 to the first chip pads 211. Further, third bonding wires 405 may be formed to electrically connect the first landing pads 111 to second landing pads 113 on the frame portion 101 of the package substrate 100. As described above, wire bonding processes for forming the bonding wires 400 (401, 403, 405) may be performed after the semiconductor chips 200 (201, 203) are stacked on the package substrate 100. The wire bonding processes may be omitted when electrical connections between the semiconductor chips 200 and/or between the semiconductor chips 200 and the package substrate 100 are achieved using through vias (e.g., through silicon vias) or bumps.

Figure 4:
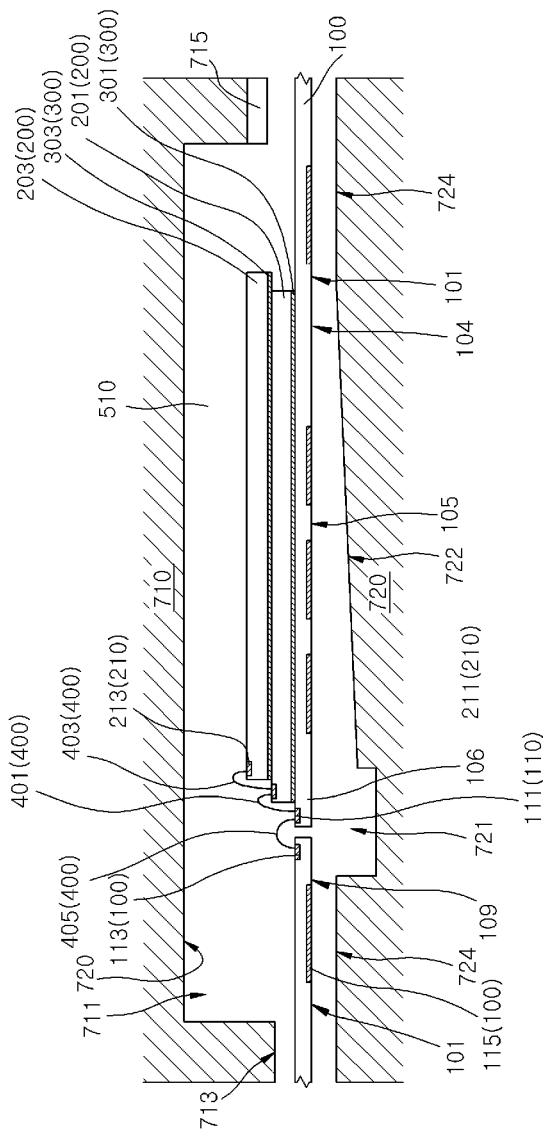

Referring to FIG. 4, the package substrate 100 and the semiconductor chips 200 mounted on the package substrate 100 may be disposed in a space between an upper frame 710 and a lower frame 720. The upper frame 710 may include an upper cavity 711 whose lower portion is open, and the lower frame 720 may include a lower cavity 721 whose upper portion is open. The lower cavity 721 may be provided to accommodate a second edge 106 of the cantilever portion 105, which is located opposite to the first edge 104 of the cantilever portion 105 and is descended in a subsequent process. The lower cavity 721 may also be configured to accommodate an extension 503 of a molding member 500 (see FIG. 1). The lower cavity 721 may also be configured to include an inclined bottom surface 722 that contacts and supports the cantilever portion 105 when the cantilever portion 105 is descended in a subsequent process, as illustrated in FIG. 6. That is, the lower cavity 721 may include a bottom groove 723 (see FIG. 7) under the separation window 107 and a space on the inclined bottom surface 722 supporting the cantilever portion 105, as illustrated in FIG. 7. The bottom groove 723 may have a substantially similar shape (e.g., a "U"-shaped configuration) as the separation window 107 when viewed from a plan view. The upper cavity 711 may have a groove shape to accommodate the semiconductor chips 200 and the bonding wires 400.

Referring to FIGS. 4 and 5, the upper and lower frames 710 and 720 may be assembled such that a bottom surface 713 of the upper frame 710 and a top surface 724 of the lower frame 720 are in contact with the package substrate 100 (e.g., the frame portion 101), and a molding material 510 may be injected into the upper cavity 711 through an inlet 715 penetrating a portion of the upper frame 710. The inlet 715 may be positioned such that a distance between the inlet 715 and the first edge 104 of the cantilever portion 105 is less than a distance between the inlet 715 and the second edge 106 of the cantilever portion 105. Thus, the molding material 510 may flow from the first edge 104 towards the second edge 106.

Referring to FIG. 6, when the molding material 510 is injected to fill the upper cavity 711, the cantilever portion 105 may be pressed down due to flow of the molding material 510. As a result, the cantilever portion 105 may descend, and the second edge 106 of the cantilever portion 105 may descend to create a level difference between the second edge 106 and the frame portion 101. In addition, the molding material 510 may be injected into the lower cavity 721 through the separation window 107.

During injection of the molding material 510, the cantilever portion 105 may descend to contact the inclined bottom surface 722. The presence of the inclined bottom surface 722 may limit how far the cantilever portion 105 descends. In the event that external connection pads 115 are formed on a bottom surface of the cantilever portion 105 and the cantilever portion 105 is in direct contact with the inclined bottom surface 722, the external connection pads 115 on the bottom surface of the cantilever portion 105 may not be covered with the molding material 510 even though the molding material 510 is continuously supplied. The inclined bottom surface 722 may be formed to be flat but not limited thereto. For example, the cantilever portion 105 may warp in shape to have a certain curvature during injection of the molding material 510. Thus, the inclined bottom surface 722 may be formed to have a convex shape in consideration of the curvature of the warped cantilever portion 105, which may maximize the contact area between the inclined bottom surface 722 and the cantilever portion 105 after the molding material 510 is injected.

As the cantilever portion 105 descends, a first distance G1 between the uppermost semiconductor chip (e.g., the second semiconductor chip 203) over the second edge 106 and a roof 712 of the upper cavity 711 may increase as compared with an initial distance therebetween. In contrast, the first edge 104 of the cantilever portion 105 may not be substantially lowered even though the cantilever portion 105 descends due to the injection of the molding material 510. Thus, a second distance G2 between the uppermost semiconductor chip (e.g., the second semiconductor chip 203) over the first edge 104 and the roof 712 of the upper cavity 711 may maintain the initial distance therebetween even after the molding material 510 is injected. Accordingly, the first distance G1 may be greater than the second distance G2 by the level difference D.

Because the first distance G1 is greater than the second distance G2, the molding material 510 may flow faster on the second semiconductor chip 203. Even though the second distance G2 on the second semiconductor chip 203 adjacent to the inlet 715 is set to be relatively small in order to reduce a total thickness of the molding material 510, the flow rate of the molding material 510 on the second semiconductor chip 203 may be increased and/or improved because the first distance G1 on the second semiconductor chip 203 far from the inlet 715 is greater than the second distance G2. Thus, the configuration of having the sloped semiconductor chips 200 may prevent the flow rate of the molding material 510 from degrading during the injection of the molding material 510. As a result, the molding material 510 may smoothly flow to suppress or prevent process defects such as voids from being formed in the upper cavity 711 on the second semiconductor chip 203.

A height of the upper cavity 711, that is, a third distance G3 between the roof 712 of the upper cavity 711 and a top surface of the package substrate 100, may correspond to a thickness of a molding member (500 of FIG. 1) which is formed by curing the molding material 510 injected into the upper cavity 711. The third distance G3 may be set to have about 0.35 millimeters (mm) for a thin package. Further, the package substrate 100 may have a thickness of about 0.14 mm, each of the stacked semiconductor chips 200 may have a thickness of about 0.08 mm, and each of the adhesion layers 300 may have a thickness of about 0.02 mm. In such a case, the second distance G2 may be set to have a small value of about 0.15 mm. Thus, if the cantilever portion 105 does not descend from the first edge 104 thereof toward the second edge 106 thereof, the molding material 510 may not smoothly flow onto the second semiconductor chip 203.

Spaces located at both sides of the semiconductor chips 200 may have a height of the third distance G3 of about 0.35 mm. If the cantilever portion 105 does not descend, a distance between a top surface of the second semiconductor chip 203 and the roof 712 of the upper cavity 711 may be the second distance G2 of about 0.15 mm. In such a case, the molding material 510 may not be smoothly injected into a spacer on the top surface of the second semiconductor chip 203, whereas the molding material 510 may be smoothly injected into the spaces located at both sides of the semiconductor chips 200. Accordingly, the flow rate of the molding material 510 may be degraded in the space on the second semiconductor chip 203, thereby causing formation of voids. However, according to the embodiments, the cantilever portion 105 descends such that the first distance G1 is greater than the second distance G2, as illustrated in FIG. 6. Thus, the descended cantilever portion 105 may prevent or suppress voids from being formed on the second semiconductor chip 203 during the injection of the molding material 510.

The second edge 106 of the cantilever portion 105 may descend during the injection of the molding material 510, thereby increasing the first distance G1. For example, if the second edge 106 of the cantilever portion 105 descends by about 0.19 mm from an initial position thereof (e.g., from the same level as the frame portion 101), the first distance G1 may increase from about 0.15 mm to about 0.34 mm. That is, the first distance G1 may increase to be close or equal to the third distance G3. Thus, the difference between the flow rate of the molding material 510 at both sides of the semiconductor chips 200 and the flow rate of the molding material 510 on the semiconductor chips 200 may be reduced to prevent or suppress voids from being formed on the second semiconductor chip 203 during the injection of the molding material 510.

After the molding material 510 is injected into the cavities 711 and 721 and is cured to form the molding member 500, the upper and lower frames 710 and 720 may be removed and external connection terminals 600 such as solder balls may be attached to the external connection pads 115 formed on the bottom surface of the package substrate 100. Subsequently, if the package substrate 100 corresponds to a panel 108 including two or more cantilever portions 105 for mass production, a singulation process may be applied to the panel 108 to form a plurality of discrete packages 10.

The various embodiments of the present invention have been disclosed above for illustrative purposes. Those skilled in the art will appreciate that various modifications, additions and substitutions are possible, without departing from the scope and spirit of the present invention as disclosed in the accompanying claims.

What is claimed is:

1. An electronic device package comprising:
 a package substrate including a frame portion and a cantilever portion surrounded by the frame portion, the cantilever portion having a first edge connected to the frame portion and descending from the first edge toward a second edge located opposite to the first edge;
 at least one semiconductor chip mounted on the cantilever portion; and
 a molding member disposed on the package substrate to cover the at least one semiconductor chip,
 wherein the molding member includes an extension that downwardly protrudes from a bottom surface of the frame portion to cover bottom surfaces of edges of the cantilever portion other than the first edge.

2. The electronic device package of claim 1, wherein a thickness of the molding member on the at least one semiconductor chip increases from the first edge toward the second edge when the cantilever portion descends.

3. The electronic device package of claim 1, wherein the frame portion is separated from edges of the cantilever portion other than the first edge by a separation window.

4. The electronic device package of claim 3, wherein the separation window has a "U"-shaped configuration.

5. The electronic device package of claim 1, wherein the at least one semiconductor chip includes a plurality of semiconductor chips which are stacked on the cantilever portion.

6. The electronic device package of claim 5, wherein the plurality of semiconductor chips are stacked to be vertically misaligned with each other such that at least first edges of the plurality of semiconductor chips constitute a step structure.

7. The electronic device package of claim 1, further comprising bonding wires that electrically connect chip pads of the at least one semiconductor chip to landing pads of the package substrate.

8. The electronic device package of claim 1, further comprising bonding wires that electrically connect chip pads of the at least one semiconductor chip to landing pads of the frame portion constituting the package substrate.

9. A method of manufacturing an electronic device package, the method comprising:
 mounting at least one semiconductor chip on a cantilever portion whose first edge is connected to a frame portion of a package substrate; and
 forming a molding member on the package substrate to cover the at least one semiconductor chip,
 wherein the cantilever portion descends from the first edge of the cantilever portion toward a second edge of the cantilever portion located opposite to the first edge during formation of the molding member.

10. The method of claim 9, wherein the molding member on the at least one semiconductor chip is formed to have a thickness that increases from the first edge toward the second edge when the cantilever portion descends.

11. The method of claim 9, wherein the molding member may be formed to include an extension that downwardly protrudes from a bottom surface of the frame portion to cover bottom surfaces of edges of the cantilever portion other than the first edge.

12. The method of claim 9, wherein forming the molding member includes:
   disposing the package substrate and the at least one semiconductor chip mounted on the package substrate in a space between an upper frame having an upper cavity and a lower frame having a lower cavity that accommodates the inclined cantilever portion; and
   injecting a molding material into the upper cavity.

13. The method of claim 12:
   wherein the molding material is injected through an inlet of the upper frame which is positioned adjacent to the first edge of the cantilever portion; and
   wherein the second edge of the cantilever portion descends as the molding material flows from the first edge of the cantilever portion toward the second edge of the cantilever portion.

14. The method of claim 13, wherein the lower frame is formed to include an inclined bottom surface that contacts and supports the cantilever portion when the cantilever portion descends.

15. The method of claim 9, wherein the package substrate is formed to include a separation window that separates the frame portion from edges of the cantilever portion other than the first edge.

16. The method of claim 9:
   wherein the at least one semiconductor chip includes first and second semiconductor chips; and
   wherein mounting the at least one semiconductor chip includes sequentially stacking the first and second semiconductor chips.

17. The method of claim 16, wherein the second semiconductor chip is stacked on the first semiconductor chip such that at least first edges of the first and second semiconductor chips constitute a step structure to expose the first edge of the first semiconductor chip.

18. The method of claim 9, further comprising forming bonding wires that electrically connect chip pads of the at least one semiconductor chip to landing pads of the package substrate.

19. A method of manufacturing an electronic device package, the method comprising:
   mounting at least one semiconductor chip on a cantilever portion whose first edge is connected to a frame portion of a package substrate;
   disposing the package substrate and the at least one semiconductor chip mounted on the package substrate in a space between an upper frame having an upper cavity and a lower frame having a lower cavity that accommodates the cantilever portion; and
   injecting a molding material into the upper cavity to form a molding member covering the at least one semiconductor chip, wherein a second edge of the cantilever portion opposite to the first edge descends into the lower cavity during injection of the molding material.

\* \* \* \* \*